United States Patent
Whalen et al.

(10) Patent No.: US 10,422,051 B2
(45) Date of Patent: Sep. 24, 2019

(54) ARTICLE COMPRISING A SEMICONDUCTING MATERIAL

(71) Applicant: The Florida State University Research Foundation, Inc., Tallahassee, FL (US)

(72) Inventors: Jeffrey Whalen, Tallahassee, FL (US); Theo Siegrist, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 66 days.

(21) Appl. No.: 15/677,706

(22) Filed: Aug. 15, 2017

(65) Prior Publication Data

US 2018/0023213 A1    Jan. 25, 2018

Related U.S. Application Data

(60) Division of application No. 14/674,567, filed on Mar. 31, 2015, now Pat. No. 9,777,405, which is a continuation of application No. PCT/US2013/067045, filed on Oct. 28, 2013.

(60) Provisional application No. 61/718,945, filed on Oct. 26, 2012.

(51) Int. Cl.
| | |
|---|---|
| C30B 29/46 | (2006.01) |
| H01B 1/10 | (2006.01) |
| C30B 9/10 | (2006.01) |
| H01B 1/08 | (2006.01) |
| C30B 9/12 | (2006.01) |
| C30B 29/22 | (2006.01) |

(52) U.S. Cl.
CPC ............... *C30B 29/46* (2013.01); *C30B 9/10* (2013.01); *C30B 9/12* (2013.01); *C30B 29/22* (2013.01); *H01B 1/08* (2013.01); *H01B 1/10* (2013.01)

(58) Field of Classification Search
CPC ...................................................... C30B 29/46
See application file for complete search history.

*Primary Examiner* — Douglas B Call
(74) *Attorney, Agent, or Firm* — Eversheds Sutherland (US) LLP

(57) ABSTRACT

Single crystals of the new semiconducting oxychalcogenide phase were synthesized using a novel crystal growth method. The crystals had low defects and homogeneous composition as characterized by single crystal X-ray diffraction and scanning electron microscopy, respectively. Heat capacity and resistivity measurements were in agreement with the calculated band structure calculations indicating semiconductivity, with a band gap of about 3 eV.

16 Claims, 6 Drawing Sheets

BARIUM
TELLURIUM
OXYGEN

ARTICLE COMPRISING A SEMICONDUCTING MATERIAL

CROSS-REFERENCE TO RELATED APPLICATIONS

This nonprovisional application is a divisional application of U.S. Nonprovisional application Ser. No. 14/674,567, now U.S. Pat. No. 9,777,405, entitled "Article Comprising a Semiconducting Material", filed on Mar. 31, 2015, which is a continuation application of PCT Application PCT/US2013/067045, entitled "An Article Comprising a Semiconducting Material", filed Oct. 28, 2013, which claims priority to provisional application No. 61/718,945, entitled "Semiconducting Oxytelluride Single Crystal $BA_2TEO$," filed on Oct. 26, 2012 by the same inventors, and each of these applications is incorporated by reference in its entirety.

STATEMENT OF GOVERNMENT SUPPORT

This invention was made with government support under grant number DE-SC0008832 awarded by the Department of Energy. The government has certain rights in the invention.

FIELD OF THE INVENTION

This invention relates generally to novel semiconductor materials. More specifically, the invention relates to oxychalcogenide crystal compositions.

BACKGROUND OF THE INVENTION

There exist many more reported crystal structures of tellurates/tellurites containing cationic $Te^{3+/4+}$, than for oxytellurides containing anionic $Te^{2-}$. Yet, semiconducting oxytelluride systems may have promise in the field of commercialized optoelectronic applications like transparent semiconductors. The complex orbital hybridizations in anion-ordered multinary crystals like oxytellurides can give rise to unique physical properties. These systems are the cutting edge of applied semiconductor technology research, but further exploration for better suited materials could result in more efficient and/or more effective functional materials. In such a raw materials intensive market, though, a semiconductor that is comprised of the most abundant and/or inexpensive elements may be of the greatest commercial interest and have the most potential for large scale applications.

The copper-based oxychalcogenides (Liu 2007, Zakutayev 2010; Ueda, et al., Thin Solid Films 496 (2006) 8-15; Ohta, et al., Solid-State Electronics 47 (2003) 2261-2267), such as LaCuOX (X=S, Se) and La2O2CdSe2, are classes of materials which may have commercial applications. (Ueda, et al., Applied Physics Letters 77 (2000) 2701-2703; Huang, et al., Journal of Solid State Chemistry 155 (2000) 366-371; Kamioka, et al., Journal of Luminescence 112 (2005) 66-70; Ramasubramanian, et al., Journal of Applied Physics 106 (2009) 6). Transition metal oxysulfides like Sm2Ti2S2O5 have also been identified as stable catalysts for photo-oxidation and reduction of water. (Ishikawa, et al., Journal of the American Chemical Society 124 (2002) 13547-13553; Meignen, et al., Journal of Solid State Chemistry 178 (2005) 1637-1643).

BRIEF SUMMARY OF THE INVENTION

The long-standing but heretofore unfulfilled need for oxychalcogenides compounds containing both anionic chalcogenides and oxygen, and methods for manufacturing these compounds, is now met by a new, useful, and nonobvious invention.

The oxychalcogenide compounds may comprise anionic tellurium, selenium or sulfur, oxygen, and an alkaline earth metal cation, wherein the molar ration of the alkaline earth metal cation and the anionic chalcogen is 2:1.

These and other important objects, advantages, and features of the invention will become clear as this disclosure proceeds.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
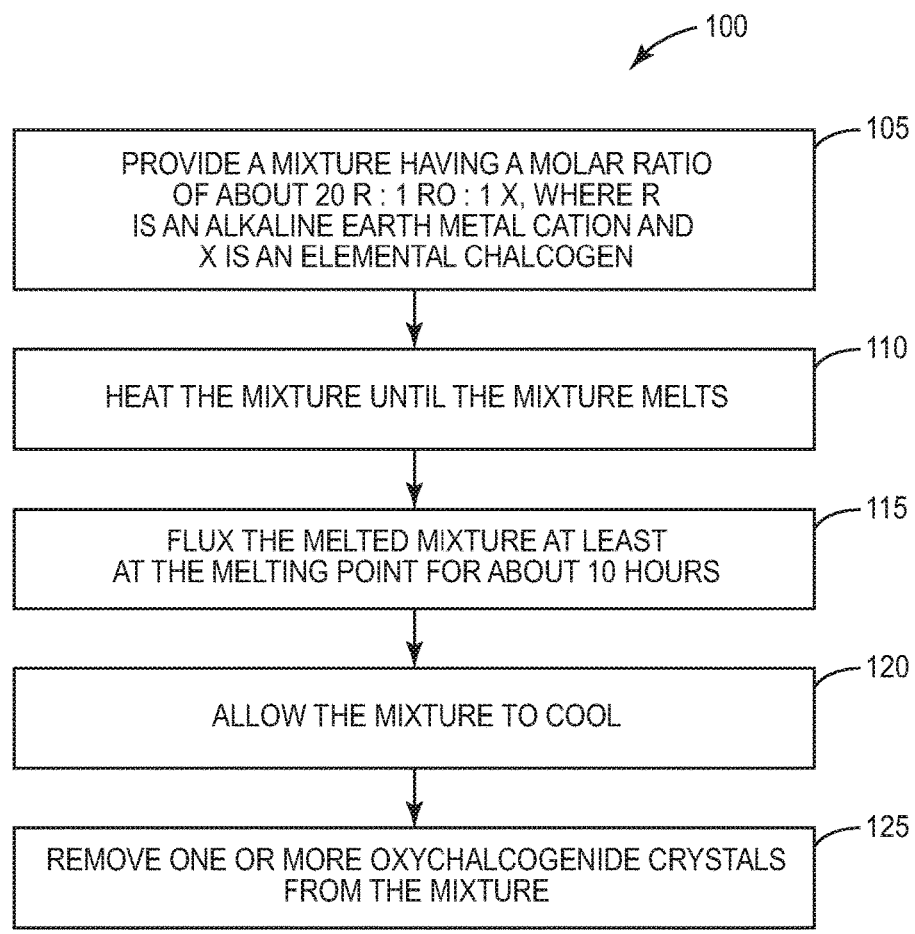
FIG. 1 is a general flow chart of an exemplary method for producing oxychalcogenide crystals.

As used herein, "about" means approximately or nearly and in the context of a numerical value or range set forth means about ±15 percent of the numerical.

Oxytellurides (OR2Te) may be better suited as transparent conductors due to their high hole mobilities. Doping of the 5p orbitals of Te increases hole mobility and conduction in LnCuOTe (Ln=La, Ce, Nd) phases more than doping of the 3p/4p orbitals of S/Se in the corresponding LaCuO (S/Se) phases.

Using metal fluxes to grow oxide single crystals may generate an advantageous chemical growth environment since oxygen is a minority constituent of the system, with the metal flux acting as a reducing agent. Good oxygen solubility in the metal flux may therefore be beneficial, and preliminary synthesis experiments have indicated high oxygen solubility in alkaline earth fluxes. In addition, low growth temperatures are desirable for discovery activities, especially coupled with low cost crucible materials. The molten alkaline flux reactions create a unique single crystal oxide growth environment and may further allow control of dopant substitution, electron transfer, and phase selectivity. Since alkaline earth metals readily form solid solutions with lanthanide metals as well as group IIIB and IVB metals, complex intermetallic phases have been grown (Stojanovic, M. and Latturner, S. E. Growth of new ternary intermetallic phases from Ca/Zn eutectic flux. J. Solid State Chem. 180, 907-914 (2007); Latturner, S. E., Bilc, D., Mahanti, S. D. and Kanatzidis, M. G. R3Au6+xAl26T (R=Ca,Sr,Eu,Yb; T=Early Transition Metal): a Large Family of Compounds with a Stuffed BaHg11 Structure Type Grown from Aluminum Flux. Inorg. Chem. 48, 1346-1355 (2009); Latturner, S. E. and Kanatzidis, M. G. RE(AuAl2)nAl2(AuxSi1-x)2: A New Homologous Series of Quaternary Intermetallics Grown from Aluminum Flux. Inorg. Chem. 47, 2089-2097

(2008)). The alkaline earth flux can be further modified to include transition element, expanding the possibilities of discovery of new phases.

Investigating the oxygen solubility in alkaline earth fluxes showed, surprisingly, that single crystal oxide growth is possible in this unique environment, and may allow for control of dopant substitution, electron transfer, and phase selectivity.

Slow cooling of the alkaline earth metal flux from about 1000° C. may kinetically force oxygen anion-metal cation organization that is high in cation concentration due to the presence of the flux. This bonding in the liquid flux may be relatively weak compared to more oxygen-rich combinations of the same ion pairs, which may allow for crystal growth. The use of eutectic mixtures therefore may allow for a temperature reduction well below the critical precipitation temperature for most oxide phases, effectively pitting thermal kinetic energy losses in competition with increased crystal lattice energies. This balance of equilibrium factors, combined with quick removal of the liquid solvent environment (quench), may lead to exclusive stabilization and isolation of metastable phases not formed at ambient temperatures and pressures.

FIG. 1 illustrates an exemplary method 100 for producing oxychalcogenide crystals according to various embodiments. At step 105, a mixture may be provided that may have a molar ratio of about 20 R:1 RO:1 X, where R is an alkaline earth metal cation and X is an elemental chalcogen. In various embodiments, the alkaline earth metal cation may comprise barium (Ba), supplied as chunks or rods (99+ percent, Acros Organics), and the RO may comprise barium oxide (BaO), supplied in powder form (99+ percent, Cerac). The elemental chalcogen may be provided, for example, as tellurium powder (99.999 percent, Puratronic, AlfaAesar). The mixture may then be heated until the mixture melts (step 110), forming a molten barium flux. At step 115, the mixture may be fluxed for about 10 hours while holding the mixture at a temperature of at least the melting point of the mixture. The mixture may then be allowed to cool (step 120), at which point one or more oxychalcogenide crystals may be removed from the mixture (step 125).

In various embodiments, doping may occur during the fluxing step in which a portion of the chalcogen anions in the crystal phase are replaced with a different anion. For example, a Group 15 pnictogen may be used to dope the material. In various embodiments, the pnictogen may be bismuth. The doping concentration may be on the order of $Ba_2OTe_{0.8}Bi_{0.2}$. The doping anion may substitute up to about 20 atomic percent of the chalcogen anions. Experimentation has indicated that doping with bismuth may change the electronic conductivity of the material making the material more conductive, which may be useful for transparent semiconductor applications. In addition, the doped material may absorb light in the ultraviolet range, and may be suitable for an ultraviolet light emitting device.

Figure 2:
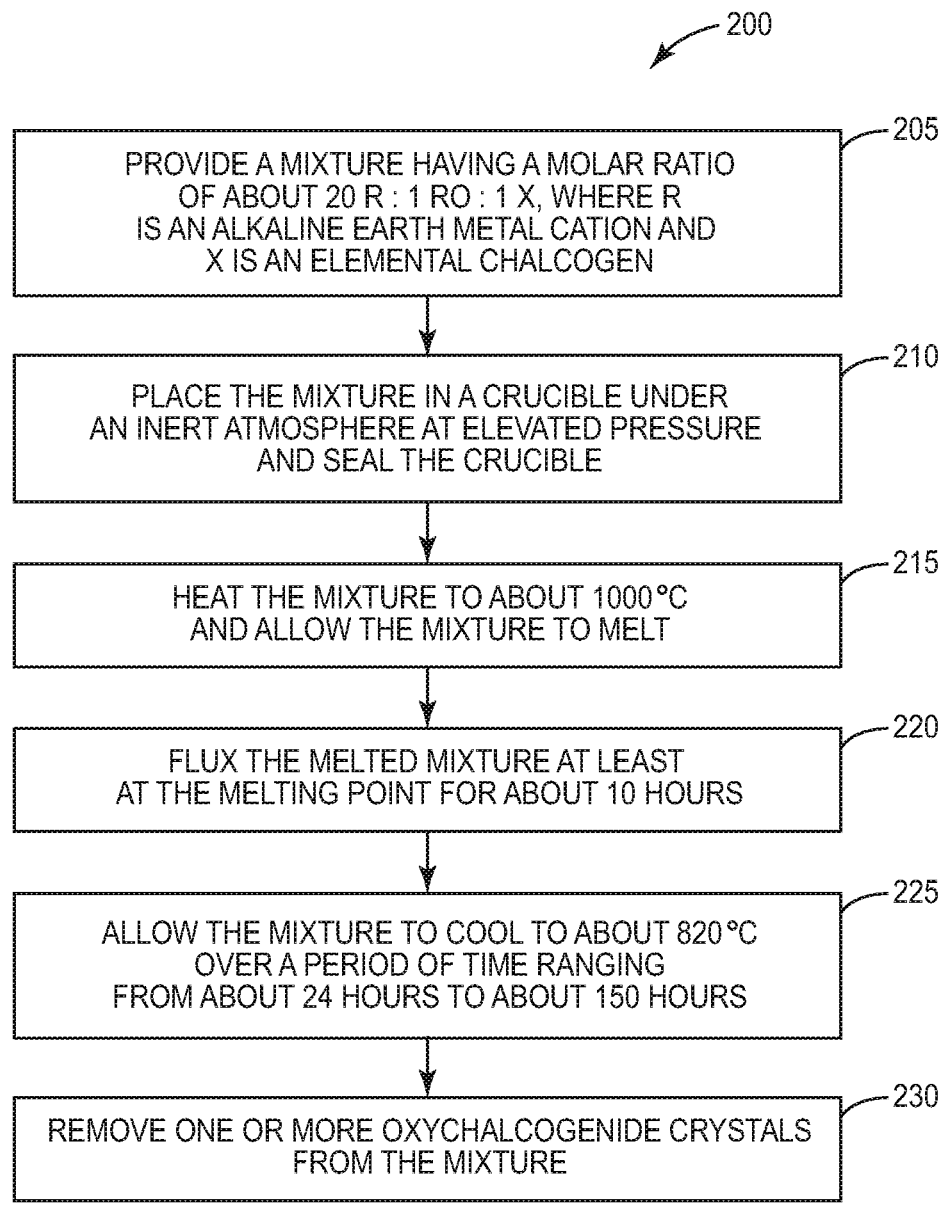
FIG. 2 is a general flow chart of an exemplary method for producing oxychalcogenide crystals.

FIG. 2 illustrates an exemplary method 200 for producing oxychalcogenide crystals according to various embodiments. Similar to method 100, a mixture may be provided that may have a molar ratio of about 20 R:1 RO:1 X, where R is an alkaline earth metal cation and X is an elemental chalcogen (step 205). At step 210, the mixture may be placed in a crucible under an inert atmosphere at elevated pressure, then the crucible may be welded shut. The crucible may also be sealed in quartz tubing under vacuum. The inert atmosphere may comprise argon gas at a pressure of about 1.5 atm. One skilled in the art will readily recognize that other gas environments (comprising a single gas or mixture of gases) may be used in place of argon, and that other pressures may be used that are higher or lower than 1.5 atm. The mixture may then be heated to about 1000° C., and the mixture allowed to melt (step 215). The mixture may then be allowed to flux at about 1000° C. (or at least the melting point of the mixture) for about 10 hours (step 220). The mixture may then be allowed to cool to about 820° C. over a period of time ranging from about 24 hours to about 150 hours (step 225). The crucible may be opened in an inert atmosphere glovebox, and then one or more oxychalcogenide crystals may be removed from the mixture (step 230).

Figure 3:
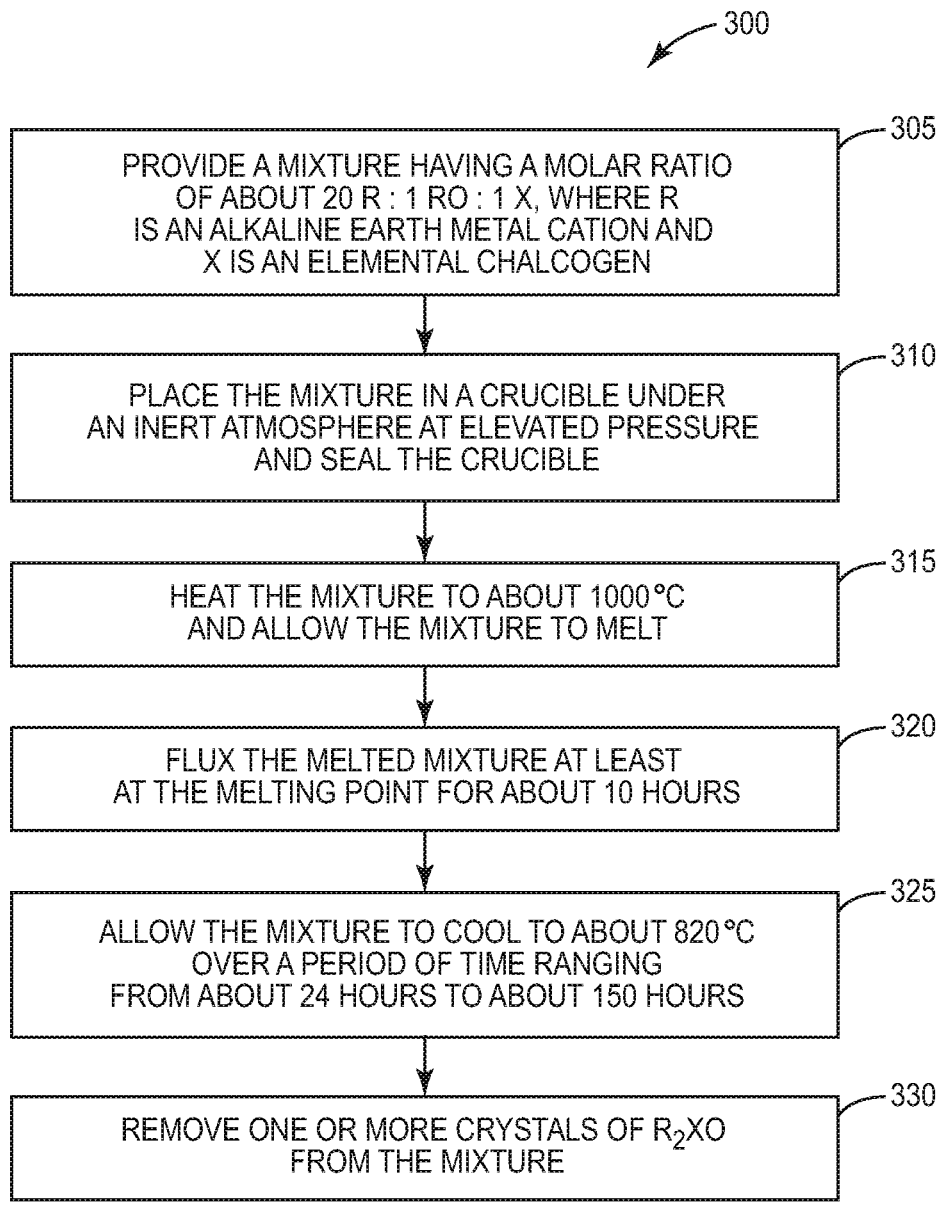
FIG. 3 is a general flow chart of an exemplary method for producing oxychalcogenide crystals.

FIG. 3 illustrates a further exemplary method 300 for producing oxychalcogenide crystals in the form of $R_2XO$ according to various embodiments. Similar to method 100, a mixture may be provided that may have a molar ratio of about 20 R:1 RO:1 X, where R is an alkaline earth metal cation and X is an elemental chalcogen (step 305). At step 310, the mixture may be placed in a crucible under an inert atmosphere at elevated pressure, then the crucible may be welded shut. The crucible may also be sealed in quartz tubing under vacuum. The inert atmosphere may comprise argon gas at a pressure of about 1.5 atm. One skilled in the art will readily recognize that other gas environments (comprising a single gas or mixture of gases) may be used in place of argon, and that other pressures may be used that are higher or lower than 1.5 atm. The mixture may then be heated to about 1000° C., and the mixture allowed to melt (step 315). The mixture may then be allowed to flux at about 1000° C. (or at least the melting point of the mixture) for about 10 hours (step 320). The mixture may then be allowed to cool to about 820° C. over a period of time ranging from about 24 hours to about 150 hours (step 325). The crucible may be opened in an inert atmosphere glovebox, and then one or more crystals of R2XO may be removed from the mixture (step 330).

Elemental analysis using EDS in a JEOL 5900 scanning electron microscope indicated the stoichiometry of an exemplary oxychalcogenide with the formula $Ba_2TeO$ having a molar Ba:Te ratio of 2:1 to within about 5 atomic percent as shown in Table 1. The crystals had a platelet morphology and micacious cleavage.

TABLE 1

Result of Elemental Analysis

| Element | Line | Intensity (c/s) | Error 2-sig | Atomic % |
|---------|------|-----------------|-------------|----------|
| O       | Ka   | 0.00            | 0.000       | 0.000[†] |
| Cu      | Ka   | 3.13            | 1.119       | 0.334    |
| Te      | La   | 286.76          | 10.707      | 31.859   |
| Ba      | La   | 553.93          | 14.882      | 67.807   |
|         |      |                 |             | 100.000 Total |

[†]Element not detected because the atomic electron values were below the detection limits for the device.

The crystals were structurally characterized by single crystal x-ray diffraction using an Oxford-Diffraction Xcalibur2 CCD system. The as-grown crystals were transferred from the glovebox under Paratone-N oil on a glass slide. The crystals were cleaved in the oil and shards of appropriate size were selected and mounted in cryoloops then aligned in a nitrogen stream for data collections at 200 K. Reflections were recorded, indexed and corrected for absorption using the Oxford-Diffraction CrysAlis software. Subsequent structure determination and refinement was carried out using SHELXTL. (Sheldrick, 2000).

A Quantum Design PPMS system was used to measure the zero-field heat capacity between 2 K and room temperature, with crystals embedded in grease. Electrical resistance was tested using 4-point contacts at room temperature. The optical reflectivity spectra of the crystals were collected with a 0.75 m focal length spectrometer and back-illuminated CCD configured to provide a spectral resolution of 1.2 nm, with a polished aluminum surface serving as a reference.

Atomic Structure and Chemical Stability

Ba2TeO is structurally comprised of one BaTe unit combined with one BaO unit. The normal structure type for both BaTe and BaO is the cubic "NaCl" structure type (Fm-3m, #225). Single crystalline $Ba_2TeO$ was obtained in platelet form and had a metallic color. The crystals averaged about 4 mm×4 mm×0.5 mm and were mildly air sensitive, showing signs of decomposition within a few hours on the benchtop.

Figure 4:
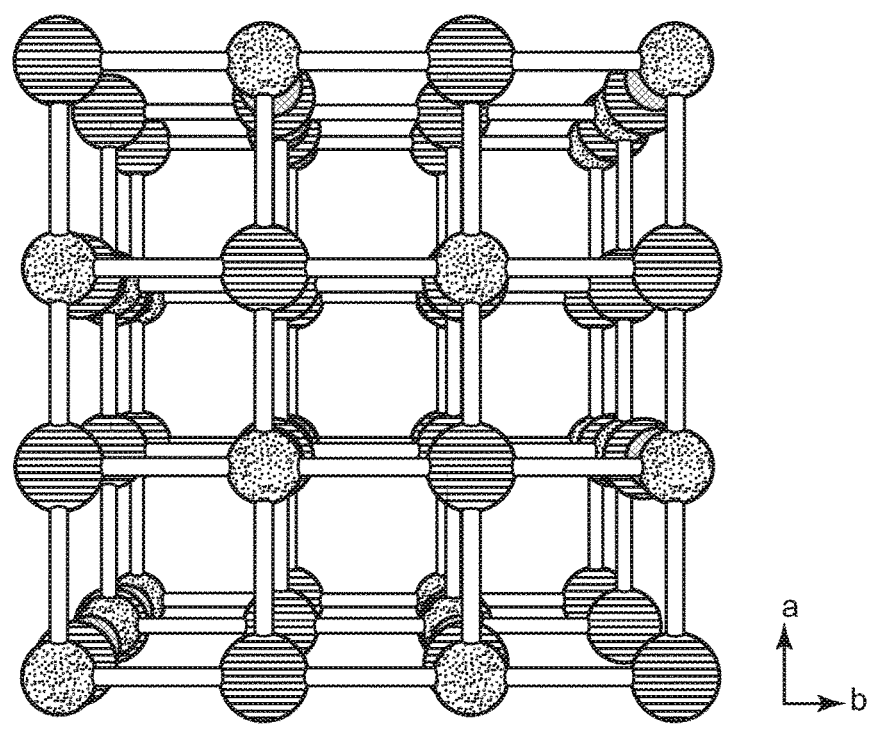
FIG. 4 is an illustration of a crystalline structure.
Figure 5:
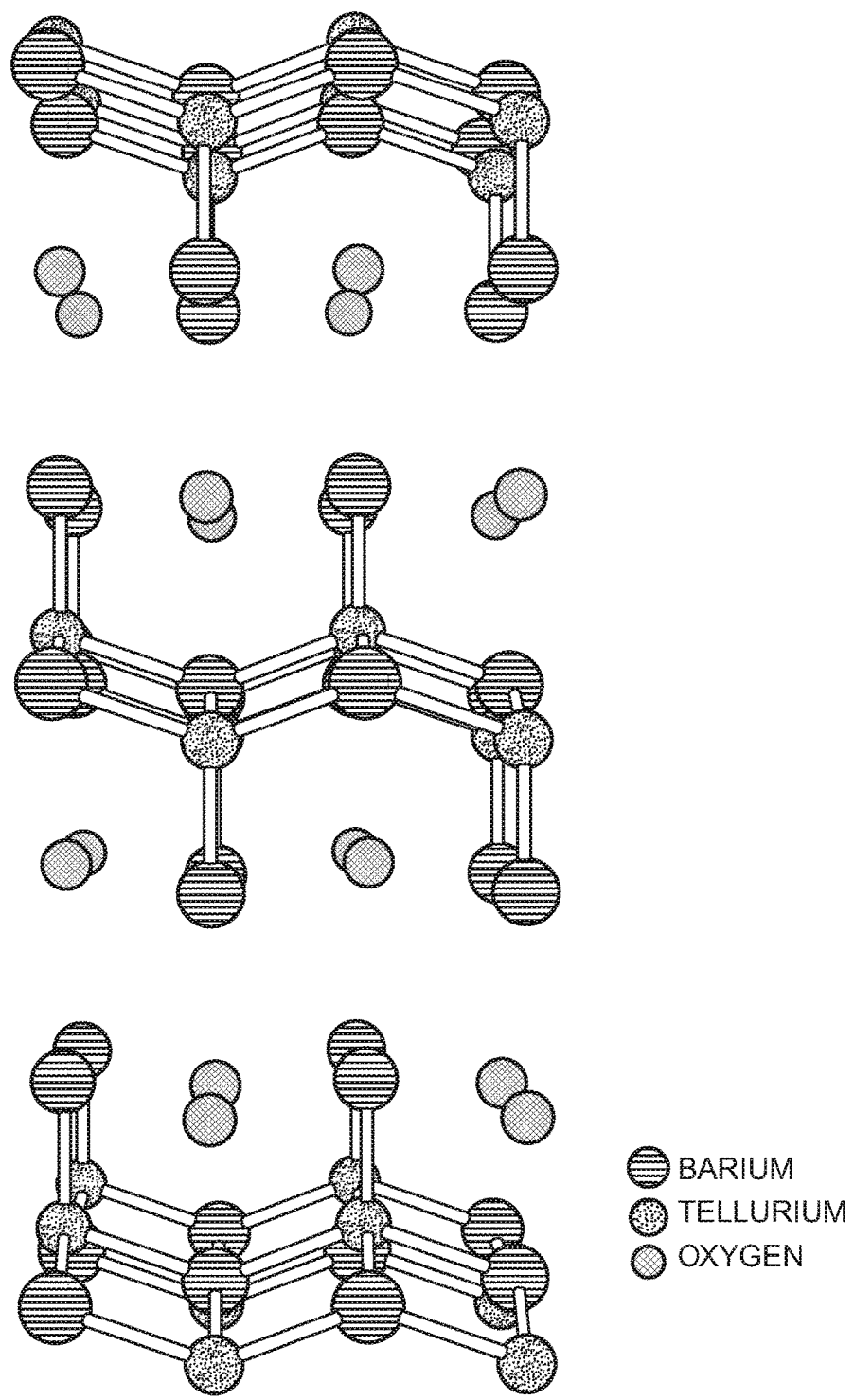
FIG. 5 is an illustration of a crystalline structure having tetragonal symmetry.
Figure 6:
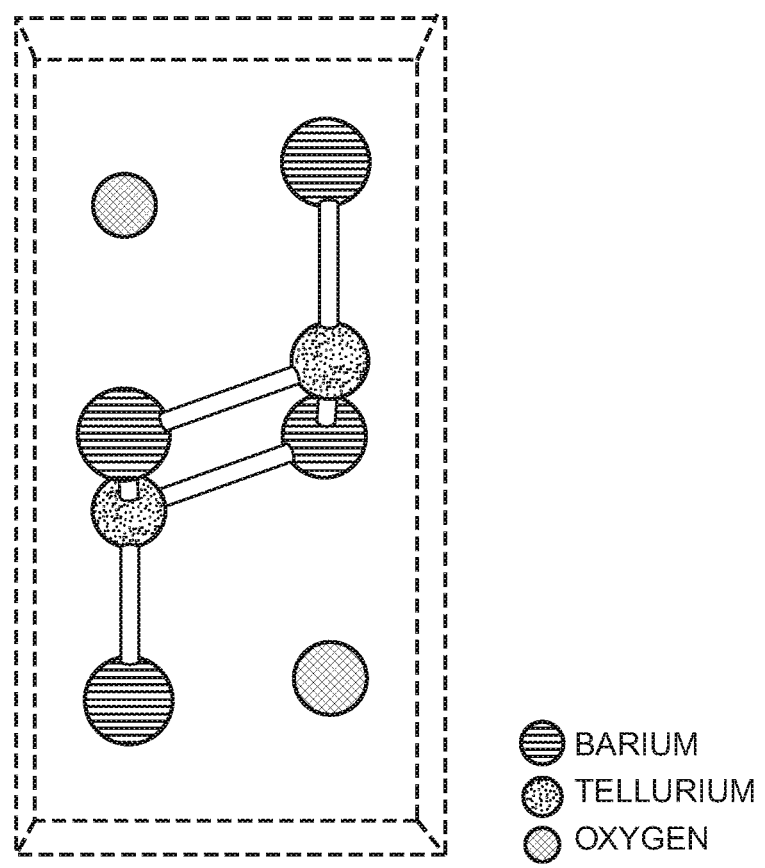
FIG. 6 is an illustration of a single unit of a crystalline structure having tetragonal symmetry.

The atomic structure of $Ba_2TeO$ is tetragonal symmetry as illustrated in FIG. 4. FIG. 5 shows an exploded view of the $Ba_2TeO$ crystal structure to better illustrate the tetragonal symmetry and the placement of the oxygen atoms within the structure. FIG. 6 illustrates a single unit of tetragonal symmetry for the $Ba_2TeO$ structure. The structure may have puckered square layers of BaO and 2D BaTe layers alternating in the a-b plane. There may be a shorter than expected bond between the Ba and O atom at 2.44 Å, which may be the result of the linking bond between the BaO and BaTe layers.

The disclosures of all publications cited above are expressly incorporated herein by reference, each in its entirety, to the same extent as if each were incorporated by reference individually.

Glossary of Claims Terms a-b plane: An atomic plane in a crystal lattice.

Alkaline earth metal: Metallic elements found in the second group (also known as Group IIA) of the periodic table, comprising beryllium (Be), magnesium (Mg), calcium (Ca), strontium (Sr), barium (Ba), and radium (Ra). Generally, very reactive metals that do not occur freely in nature.

Anionic: Having a negative electrical charge, such as an ion with more electrons than protons.

$Ba_2TeO$: A semiconducting oxytelluride compound containing barium.

Barium: Chemical element (Ba) with atomic number 56. Barium is an alkaline earth metal.

Cation: An ion having fewer electrons than protons, thus having a positive charge.

Chalcogen: The elements sulfur (S), selenium (Se), and tellurium (Te).

Chalcogenide: A compound containing a chalcogen.

Crucible: A container that can withstand very high temperatures and is used for metal, glass, and pigment production as well as various other modern laboratory processes.

Crystal: Solid material whose constituent atoms, molecules, or ions are arranged in an orderly, repeating pattern extending in all three spatial dimensions.

Doping: The process of intentionally introducing impurities into a semiconductor to change the electrical properties of the semiconductor.

Fluxing: A process by which molten metals are brought into contact with one another to form an alloy. The flux may act as a reducing agent.

Oxychalcogenide: A compound containing a chalcogen ion and oxygen.

Oxygen: Chemical element (O) with atomic number 8.

Oxytelluride: A compound containing a telluride ion (Te2−) and oxygen.

Pnictogen: Elements found in the fifteenth group (also known as Group VA) of the periodic table, comprising nitrogen (N), phosphorus (P), arsenic (As), antimony (Sb), and bismuth (Bi).

Selenium: Chemical element (Se) with atomic number 34.

Sulfur: Chemical element (S) with atomic number 16.

Tellurium: Chemical element (Te) with atomic number 52.

Tetragonal structure: A crystalline structure with a fourfold symmetry axis.

It is also to be understood that the following claims are intended to cover all of the generic and specific features of the invention herein described, and all statements of the scope of the invention which, as a matter of language, might be said to fall there between.

What is claimed is:

1. A method for forming an oxychalcogenide composition, comprising:
    providing a mixture having a molar ratio of about 20 R:1 RO:1 X, where R is an alkaline earth metal cation, X is an elemental chalcogen, and O is oxygen;
    heating the mixture until the mixture melts;
    fluxing the melted mixture at least at the melting point for about 10 hours;
    allowing the mixture to cool; and
    removing one or more oxychalcogenide crystals from the mixture, where the one or more oxychalcogenide crystals, comprise:
        a tetragonal crystal of repeating units of RX' and RO;
            wherein R is an alkaline earth metal cation, X' is an anionic chalcogen, and O is oxygen;
            wherein the alkaline earth metal cation of RO is integrated into a crystalline structure with the unit of RX'; and
            wherein the R:X' molar ratio is about 2:1.

2. The method of claim 1, wherein the mixture is heated to about 1,000° C.

3. The method of claim 1, wherein the mixture is cooled to about 820° C. over a period of time ranging from about 24 hours to about 150 hours.

4. The method of claim 1, wherein the oxychalcogenide composition is $Ba_2TeO$.

5. The method of claim 1, wherein the elemental chalcogen comprises tellurium.

6. The method of claim 1, further comprising adding a doping agent other than the elemental chalcogen to the mixture such that a doping anion is substituted for a portion of the anionic chalcogen of the one or more oxychalcogenide crystals.

7. The method of claim 6, wherein the doping agent comprises a pnictogen.

8. The method of claim 7, wherein the pnictogen comprises bismuth.

9. A method for forming an oxychalcogenide composition, comprising:
    providing a mixture having a molar ratio of about 20 R:1 RO:1 X, where R is an alkaline earth metal cation, X is an elemental chalcogen, and O is oxygen;
    placing the mixture in a crucible;
    sealing the crucible;
    heating the mixture until the mixture melts;
    fluxing the melted mixture at least at the melting point for about 10 hours;

allowing the mixture to cool; and removing one or more oxychalcogenide crystals from the mixture, where the one or more oxychalcogenide crystals, comprise:

a tetragonal crystal of repeating units of RX' and RO;
wherein R is an alkaline earth metal cation, X' is an anionic chalcogen, and O is oxygen;
wherein the alkaline earth metal cation of RO is integrated into a crystalline structure with the unit of RX'; and
wherein the R:X' molar ratio is about 2:1.

10. The method of claim 9, wherein the step of heating the mixture until the mixture melts is performed to a temperature of 1000° C.

11. The method of claim 9, wherein the step of allowing the mixture to cool is performed at a rate of 1.2 degrees per hour to 7.4 degrees per hour.

12. The method of claim 9, wherein the step of placing the mixture into the crucible is performed in an inert atmosphere.

13. The method of claim 12, wherein the inert atmosphere is a single inert gas or a mixture of inert gases.

14. The method of claim 13, wherein the single inert gas is argon.

15. The method of claim 12, wherein the step of placing the mixture into the crucible is performed at an elevated pressure.

16. The method of claim 9, further comprising doping the mixture, wherein the doping of the mixture comprises:

adding a pnictogen to the mixture such that the pnictogen is present in the one or more oxychalcogenide crystals at an amount up to about 20 atomic percent of the anionic chalcogen.

* * * * *